(12) United States Patent
Wan et al.

(10) Patent No.: US 12,191,220 B2
(45) Date of Patent: Jan. 7, 2025

(54) HYBRID INTERPOSER OF GLASS AND SILICON TO REDUCE THERMAL CROSSTALK

(71) Applicant: Intel Corporation, Santa Clara, CA (US)

(72) Inventors: Zhimin Wan, Chandler, AZ (US); Chandra Mohan Jha, Tempe, AZ (US); Je-Young Chang, Tempe, AZ (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 1030 days.

(21) Appl. No.: 16/659,395

(22) Filed: Oct. 21, 2019

(65) Prior Publication Data

US 2021/0118756 A1 Apr. 22, 2021

(51) Int. Cl.
| | |
|---|---|
| *H01L 23/15* | (2006.01) |
| *H01L 23/00* | (2006.01) |
| *H01L 23/373* | (2006.01) |
| *H01L 23/498* | (2006.01) |
| *H01L 25/18* | (2023.01) |

(52) U.S. Cl.
CPC .......... *H01L 23/15* (2013.01); *H01L 23/3732* (2013.01); *H01L 23/3738* (2013.01); *H01L 23/49816* (2013.01); *H01L 23/49861* (2013.01); *H01L 24/13* (2013.01); *H01L 24/29* (2013.01); *H01L 24/73* (2013.01); *H01L 25/18* (2013.01); *H01L 2224/73103* (2013.01)

(58) Field of Classification Search
CPC ...... H01L 23/15; H01L 23/3732; H01L 25/18
See application file for complete search history.

(56) References Cited

U.S. PATENT DOCUMENTS

| | | | | |
|---|---|---|---|---|
| 9,349,681 | B1 * | 5/2016 | Kelly | ...................... H01L 25/16 |
| 2011/0044015 | A1 * | 2/2011 | Koide | ............... H01L 23/49838 29/830 |
| 2014/0073087 | A1 * | 3/2014 | Huang | .................... H01L 21/56 438/107 |
| 2016/0336259 | A1 * | 11/2016 | Shen | ................. H01L 23/49827 |

FOREIGN PATENT DOCUMENTS

CN 108766954 A * 11/2018 ....... H01L 21/76835

* cited by examiner

*Primary Examiner* — Michele Fan
(74) *Attorney, Agent, or Firm* — Schwabe, Williamson & Wyatt, P.C.

(57) ABSTRACT

Embodiments include semiconductor packages. A semiconductor package includes a hybrid interposer with a first region and a second region. The first region is comprised of glass or low thermal conductive materials, and the second region is comprised of silicon or diamond materials. The semiconductor package includes a first die on the first region of the hybrid interposer, a second die on the second region of the hybrid interposer, and an integrated heat spreader over the first die, the second die, and the hybrid interposer. The hybrid interposer includes first and second interconnects, where the first interconnects vertically extend from a bottom surface of the first region to a top surface of the first region, and where the second interconnects vertically extend from a bottom surface of the second region to a top surface of the second region. The first interconnects are through-glass vias, and the second interconnects are through-silicon vias.

14 Claims, 4 Drawing Sheets

HYBRID INTERPOSER OF GLASS AND SILICON TO REDUCE THERMAL CROSSTALK

FIELD

Embodiments relate to packaging semiconductor devices. More particularly, the embodiments relate to semiconductor devices with hybrid interposers comprised of low thermal conductive materials and silicon to reduce thermal crosstalk.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as microelectronic packages, while optimizing the performance of each device, however is not without issue.

One main issue involves the thermal management of such packages. For example, thermal management of microelectronic packages is becoming extremely important as the power requirements and the number of dies of the microelectronic packages steadily increase. These microelectronic packages typically include silicon interposers coupling central processing unit (CPU) dies and memory dies (e.g., high-bandwidth memory (HBM) dies), especially as HBM dies are rapidly increasing in usage with client and/or server products. The existing silicon interposers are passive and include metal traces that are deposited above the silicon interposers.

The HBM dies can be connected to the CPU dies using these bulk passive silicon interposers and/or small bridge dies that are embedded in the substrates of the packages. Additionally, the bottom surfaces of the HBM dies (or the stack of HBM dies) generally include high power hotspots. These hotspots generate heat that is usually difficult to dissipate due to the increased resistance of the HBM dies. In this aspect, the silicon interposer can help the local spreading of the HBM hotspots and mitigate the temperature. However, the silicon interposers can also lead to increase the heat transfer path from the CPU dies to the HBM dies, which also heats up the HBM dies even when the HBM dies are running on very low power.

This increased heat transfer path thus leads to increased thermal crosstalk from the top dies (e.g., the CPU and HBM dies) through the silicon interposer, which is another major problem of the thermal management of these packages. Accordingly, existing packaging solutions can utilize liquid cooling systems, high air-flow rate systems, and larger form-factor systems. These existing packaging solutions, however, lead to additional issues such as increased costs, leakage concerns, and limited form-factor designs and applications.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
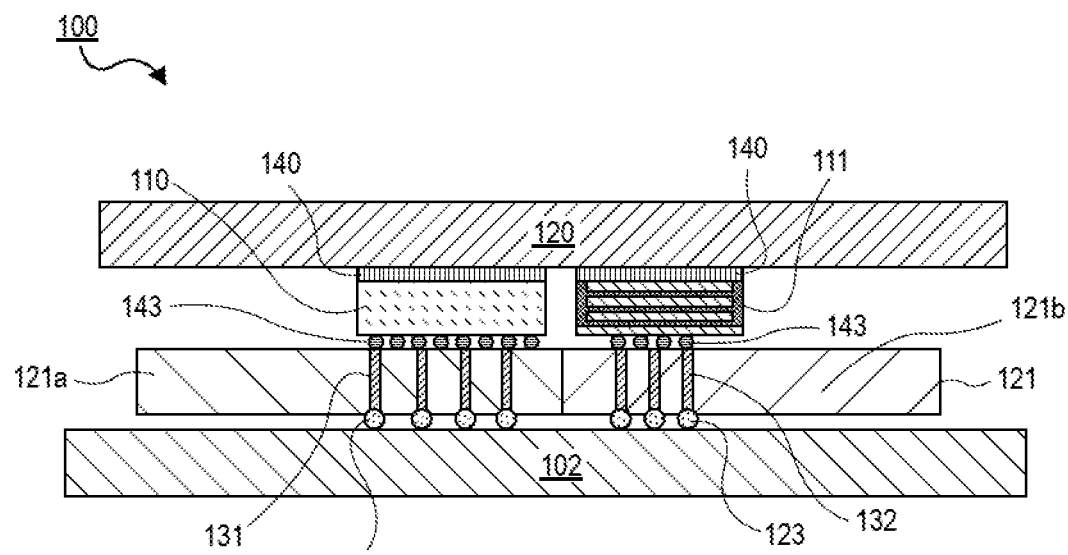
FIG. 1 is an illustration of a cross-sectional view of a semiconductor package with an integrated heat spreader (IHS), a plurality of dies, a hybrid interposer, and a package substrate, according to one embodiment.

Described herein are semiconductor packages with hybrid interposers and methods of forming such semiconductor packages. The semiconductor packages described below and methods of forming such semiconductor packages may include an integrated heat spreader (IHS), a plurality of dies (e.g. a central processing unit (CPU) die, a graphic processing unit (GPU) die, a high-bandwidth memory (HBM) die, a stack of dies, etc.), a hybrid interposer, and a package substrate, according to some embodiments. Accordingly, in the embodiments described below, the hybrid interposer may include a first region (e.g., a region comprised of glass), one or more second regions (e.g., a region(s) comprised of silicon), a plurality of through-glass vias (TGVs), and a plurality of through-silicon vias (TSVs).

The semiconductor package described herein may implement the hybrid interposer to couple, for example, the CPU die (or a CPU/graphic processing unit (CPU/GPU) die) and the stack of dies (or stacked dies) to the package substrate. As used herein, a "stack of dies" may refer to two or more dies (e.g., HBM dies) that are stacked on top of each other. Additionally, the "stack of dies" may also refer to a single monolithic die comprised of one or more stacked dies that are encapsulated (or molded/embedded) within the single monolithic die. For some embodiments, the hybrid interposer described herein may be comprised of silicon and low thermal conductive materials, such as comprised of silicon and glass materials. In other embodiments, the hybrid interposer may be comprised of solely low thermal conductive materials, such as comprised of solely glass materials. Additionally, in another embodiment, the hybrid interposer may be comprised of low thermal conductive materials and diamond materials, such as comprised of glass and diamond materials. For example, the hybrid interposer may have the first region (e.g., the glass region) disposed below the first die (or the CPU/GPU die), while the second region (or second regions) may be disposed below the second die (or the stack of HBM dies). Note that, the hybrid interposer may be mainly described as including glass materials, but the hybrid interposer is not limited to the described glass materials and thus may include any other desired low thermal conductive materials (e.g., the low thermal conductive materials may have a thermal conductivity of approximately 10 W/mK or less).

The embodiments described herein provide improvements to existing packaging solutions by implementing the thermal benefits of both silicon and glass materials into the hybrid interposer, such as the local thermal spreading benefit from the silicon material(s), and the lower thermal crosstalk benefit due to the low thermal conductivity from the glass material(s). For example, the heat of the CPU/GPU die that passes through the hybrid interposer may be substantially reduced due to the low thermal conductivity of the first region of the hybrid interposer, while the second region of the hybrid interposer below the HBM die may improve the local spreading of hotspots and substantially reduce the temperature of the HBM die. Furthermore, the embodiments of the hybrid interposer enable improving packaging solutions by (i) reducing the crosstalk from the CPU die to the HBM die, which therefore results in the HBM die having a lower temperature as compared to the temperature of the CPU die, and (ii) reducing the overall costs of the semiconductor package with materials such as glass or the like.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with IHSs, dies, hybrid interposers, and package substrates.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. For some embodiments, the semiconductor package 100 may include an IHS 120, a plurality of dies 110-111, a hybrid interposer 121, and a package substrate 102, according to one embodiment. The hybrid interposer 121 may be disposed on and coupled to the package substrate 102 with a plurality of solder balls 123. In some embodiments, the hybrid interposer 121 may include a first region 121a, a second region 121b, a plurality of TGVs 131 (or a plurality of first interconnects), and a plurality of TSVs 132 (or a plurality of second interconnects). In these embodiments, the first region 121a may be a region of the hybrid interposer 121 comprised of glass, low thermal conductive materials, or the like (e.g., the first region 121a may be a glass region). Additionally, in these embodiments, the second region 121b may be a region of the hybrid interposer 121 comprised of silicon or the like (e.g., the second region 121b may be a silicon region).

In an embodiment, the dies 110-111 may be disposed on and coupled to the hybrid interposer 121 with a plurality of solder balls 143. For some embodiments, the dies 110-111 may include a first die 110 and a second die 111. In some embodiments, the first die 110 may be a CPU/GPU die, while the second die 111 may be a stack of dies (e.g., a stack of HBM dies, a stack of high-powered dies, or the like). As described above, the semiconductor package 100 may position the first die 110 directly over the first region 121a of the hybrid interposer 121, and the second die 111 directly over the second region 121b of the hybrid interposer 121. In an embodiment, the IHS 120 may be disposed over the first and second dies 110-111, where the IHS 120 may be coupled to the first and second dies 110-111 with a thermal interface material (TIM) 140. The IHS 120 may be a heatsink. In one embodiment, the heatsink 120 may be a single/shared heatsink disposed over both the first and second dies 110-111 as shown in FIG. 1. Alternatively, in another embodiment, the heatsink 120 may be a split heatsink separated into two separate heatsinks as shown below in FIGS. 3A-3C, where one heatsink may be disposed over the first die 110, and the other heatsink may be disposed over the second die 111.

According to one embodiment, the semiconductor package 100 is merely one example of an embodiment of a semiconductor packaged system. That is, the semiconductor package 100 is not limited to the illustrated semiconductor packaged system, and thus may be designed/formed with fewer, alternate, or additional packaging components and/or with different interconnecting structures. For example, while one IHS 120, two dies 110-111, one package substrate 102, and one hybrid interposer 121 with one first region 121a and one second region 121b are illustrated, it is to be appreciated that any number of IHSs 120, dies 110-111, and hybrid interposers 121 with first regions 121a and second regions 121b may be positioned on/over the package substrate 102.

For one embodiment, the semiconductor package 100 may include a ball grid array (BGA) package, a land grid array (LGA) package, and/or a pin grid array (PGA) package. For one embodiment, as described above, the first and second dies 110-111 and the hybrid interposer 121 may be coupled to the package substrate 102 via the solder balls 123 and 143 that may be implemented as solder bumps/joints formed from respective microbumps. A solder ball (or joint) formed by soldering of a microbump according to an embodiment may itself be referred to as a "bump" and/or a "microbump." Additionally, for other embodiments, one or more of the first and second dies 110-111, the hybrid interposer 121, and the package substrate 102 may be coupled using an anisotropic conductive film (ACF) or the like.

The package substrate 102 may include a variety of electronic structures formed thereon or therein. In certain embodiments, the package substrate 102 may be an organic substrate made up of one or more layers of polymer base materials, with conducting regions for transmitting signals. For some embodiments, the package substrate 102 may include, but is not limited to, a package, a substrate, a printed circuit board (PCB), and a motherboard. In one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where the dielectric layers may be a photosensitive dielectric layer. For one embodiment, the PCB 102 may also include one or more conductive layers, which may further include copper (or metallic) traces, lines, pads, vias, holes, and/or planes.

For one embodiment, the first and second dies 110-111 may include, but are not limited to, a semiconductor die, an electronic device (e.g., a wireless device), an integrated circuit (IC), a CPU, a GPU, a CPU/GPU, a microprocessor, a platform controller hub (PCH), a memory (e.g., a HBM), and/or a field-programmable gate array (FPGA). In particular, the first die 110 may be a CPU/GPU die, and the second die 111 may be a stack of dies (e.g., a stack of HBM dies or the like). The first and second dies 110-111 may be formed from a material such as silicon and have circuitry thereon that is to be coupled to the package substrate 102. Although some embodiments are not limited in this regard, the package substrate 102 may in turn be coupled to another body, for example, a computer motherboard (or the like).

In one embodiment, the first die 110 may have a thickness that is substantially equal to a thickness of the second die 111. While, in another embodiment, the thickness of the first die 110 may be different from the thickness of the second die 111, where the thickness of the first die 110 may be substantially equal to the combined thicknesses of the second die 111 and the second region 121b of the hybrid interposer 121 (e.g., as shown with the first and second dies 310-311 and the second region 321b of the hybrid interposer 321 of FIG. 3A). For one embodiment, the first die 110 may have a top surface that is substantially coplanar to a top surface of the second die 111. Note that, in some embodiments, the thickness of the TIM 140 disposed over the first die 110 may be substantially equal to or different from the thickness of the TIM 140 that is disposed over the second die 111.

One or more connections between the package substrate 102, the first and second dies 110-111, and the hybrid interposer 121—e.g., including some or all of the solder bumps 123 and 143, the TGVs 131, and TSVs 132—may include one or more interconnect structures and underfill layers if desired. In some embodiments, these interconnect structures (or connections) may variously comprise an alloy of nickel, palladium, and tin (and, in some embodiments, copper). For one embodiment, the underfill layers may be one or more polymer materials that are injected between the respective components. Alternatively, the underfill layers may be molded underfills (MUF) or the like.

In some embodiments, the hybrid interposer 121 may couple the first die 110 to the second die 111, where the hybrid interposer 121 also may couple the first and second dies 110-111 to the package substrate 102 with the TGVs 131 and the TSVs 132. In one embodiment, the first region 121a (or the glass region) of the hybrid interposer 121 may be disposed below the first die 110 (or the CPU/GPU die), while the second region 121b (or the silicon region) of the hybrid interposer 121 may be disposed below the second die 111 (or the stack of dies). As such, with the first and second regions 121a-b of the hybrid interposer 121, the crosstalk between the first and second dies 110-111 and the heat from the first die 110 through the hybrid interposer 121 may both be substantially reduced due to the low thermal conductivity of the first region 121a (e.g., the low thermal conductivity of the first region 121a may be approximately 1 W/mK); while the local spreading of the hotspots below the second die 111 and the temperature of the second die 111 may both be substantially reduced due to the second region 121b of the hybrid interposer 121.

For one embodiment, the hybrid interposer 121 may be comprised of one or more materials, including glass, crystal, diamond, low thermal conductive materials, silicon, glass-based materials, and/or silicon-based materials. In some embodiments, the hybrid interposer 121 may be comprised of silicon and glass (or the like), where the first region 121a of the hybrid interposer 121 is comprised of glass, and the second region 121b of the hybrid interposer 121 is comprised of silicon. In other embodiments, the hybrid interposer 121 may be solely comprised of glass materials or any similar low thermal conductive materials (e.g., as shown with the region 321d of the hybrid interposer 321 of FIG. 3C), where the low thermal conductive materials may have a thermal conductivity of approximately 10 W/mk or less. Additionally, in another embodiment, the hybrid interposer 121 may be comprised of glass and diamond (or the like) (e.g., as shown with the first and second regions 321a and 321c of the hybrid interposer 321 of FIG. 3B).

In some embodiments, the TGVs 131 may vertically extend from the bottom surface to the top surface of the first region 121a of the hybrid interposer 121. Likewise, the TSVs 132 may vertically extend from the bottom surface to the top surface of the second region 121b of the hybrid interposer 121. The hybrid interposer 121 may implement the TGVs 131 to couple the first die 110 to the package substrate 102, and the TSVs 132 (or both the TGVs and TSVs 131-132) to couple the second die 111 to the package substrate 102. In one embodiment, the hybrid interposer 121 may include the TGVs 131 and the TSVs 132 that may be comprised of copper or the like.

In one embodiment, the TGVs 131 may have a thickness that is substantially equal to a thickness of the TSVs 132. In other embodiments, the TGVs 131 may have a thickness that is greater than a thickness of the TSVs 132 (e.g., as shown with the TGVs 231 and the TSVs 232 of FIG. 2). For one embodiment, the hybrid interposer 121 may have a thickness of approximately 100 um or less. In some embodiments, the first region 121a of the hybrid interposer 121 may have a footprint (or an x-y area) that is greater than a footprint of the second region 121b of the hybrid interposer 121 (e.g., as shown with the first and second regions 221a-b of the hybrid interposer 221 of FIG. 2). In another embodiment, the first region 121a of the hybrid interposer 121 may have a footprint that is approximately equal to a footprint of the second region 121b of the hybrid interposer 121. Additionally, note that, while only one first region 121a and one second region 121b with approximately equal widths are shown in FIG. 1, it is to be appreciated that any number of first regions 121a and second regions 121b with equal/different widths may be implemented into the hybrid interposer 121 (e.g., as shown with the one first region 221a and the two second regions 221b of the hybrid interposer 221 of FIG. 2).

Furthermore, as shown in FIG. 1, the TIM 140 may be directly coupled onto the top surfaces of the first and second dies 110-111 and the bottom surface of the IHS 120. In one embodiment, the TIM 140 may be a solder TIM (STIM) such as an indium STIM or the like. In other embodiments, the TIM 140 may include one or more highly thermal conductivity materials. For example, the TIM 140 may be a metallic TIM, a STIM, a polymer TIM (PTIM), and/or any similar highly thermal conductive material(s).

In one embodiment, the IHS 120 may be disposed over the TIM 140, the first and second dies 110-111, the hybrid interposer 121, and the package substrate 102. The IHS 120 may be manufactured (or shaped) to include a lid and/or a plurality of legs (or pedestals), where the lid of the IHS 120 may be directly disposed on the top surface of the TIM 140, and the legs of the IHS 120 may be directly disposed on the top surface of the package substrate 102. In some embodiments, the IHS 120 may be a heatsink, a heat spreader, a heat exchanger, a manifold, a cold plate, and/or any similar thermal solution (or device) that may be used to help transfer the heat from the electrical components of the semiconductor package 100 to the ambient environment (or an additional heat spreader). In some embodiments, the heatsink 120 may be a single/shared heatsink disposed over both the first and second dies 110-111, or the heatsink 120 may be a split heatsink separated into two separate heatsinks individually disposed over the first die 110 only and the second die 111 only.

Note that the semiconductor package 100 may include fewer or additional packaging components based on the desired packaging design.

Figure 2:
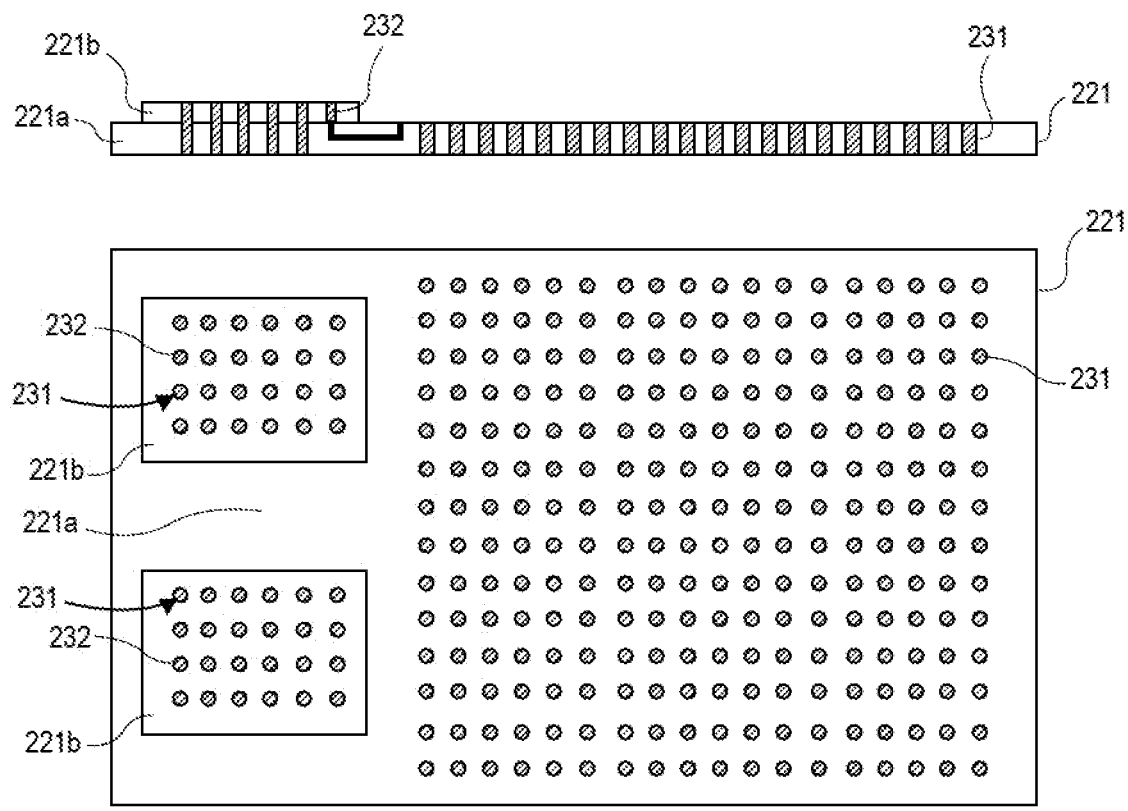
FIG. 2 are illustrations of a cross-sectional view and a plan view of a hybrid interposer with a first region, one or more second regions, a plurality of through-glass vias (TGVs), and a plurality of through-silicon vias (TSVs), according to one embodiment.

Referring now to FIG. 2, cross-sectional and plan illustrations of a hybrid interposer 221 is shown, in accordance with an embodiment. For some embodiments, the hybrid interposer 221 may include a first region 221a, one or more second regions 221b, a plurality of TGVs 231, and a plurality of TSVs 232, according to one embodiment. The hybrid interposer 221 may be substantially similar to the hybrid interposer 121 described above in FIG. 1. Likewise, the components of the hybrid interposer 221 may be substantially similar to the components of the hybrid interposer 121 described above in FIG. 1. Accordingly, the first region 221a, the second regions 221b, the TGVs 231, and the TSVs 232 of the hybrid interposer 221 may be substantially similar to the first region 121a, the second regions 121b, the TGVs 131, and the TSVs 132 of the hybrid interposer 121 described above in FIG. 1.

As shown in FIG. 2, the hybrid interposer 221 may be comprised of the first region 221a and the second regions 221b. In some embodiments, the second regions 221b may be disposed directly on the first region 221a, where the first region 221a may include the TGVs 231, and the second regions 221b may include the TSVs 232. In an embodiment, the TSVs 232 of the second regions 221b may be directly coupled onto the TGVs 231 of the first region 221a. As shown and described above in FIG. 1, a first die (or a CPU/GPU die) may be disposed directly on and coupled to the TGVs 231 of the first region 221a of the hybrid interposer 221, while one or more second dies (or HBM die stacks) may be disposed directly on and coupled to the TSVs 232 of the second region 221b of the hybrid interposer 221. In these embodiments, the TGVs and TSVs 231-232 of the hybrid interposer 221 may be used to conductively couple the first die to the second dies. Likewise, in such embodiments, the TGVs and TSVs 231-232 of the hybrid interposer 221 may be used to conductively couple the first and second dies to a package substrate (or the like).

In some embodiments, the TGVs and TSVs 231-232 may be respectively implemented on the first region 221a and the second regions 221b separately. That is, the TGVs 231 may be formed into the first region 221a, separately from the TSVs 232 may be formed into the second regions 221b. In one embodiment, the TGVs 231 of the first region 221a may be subsequently coupled (or bonded) together with the TSVs 232 of the second regions 221b by a flip-chip process or the like. Alternatively, in another embodiment, the second regions 221b (or the bare silicon regions) may be coupled to the first region 221a (or the bare glass region) with an oxide bounding process (or the like), subsequently forming (or drilling) via holes into the respective first and second regions 221a-b with a laser process (or the like), and disposing (or depositing/filling) the via holes into the respective first and second regions 221a-b with an electrolytic plating process or the like.

For one embodiment, the hybrid interposer 221 may have a thickness of approximately 100 um or less. In some embodiments, the first region 221a of the hybrid interposer 221 may have a thickness that is greater than a thickness of the second regions 221b of the hybrid interposer 221. In other embodiments, the first region 221a of the hybrid interposer 221 may have a thickness that is approximately equal to a thickness of the second regions 221b of the hybrid interposer 221.

Additionally, as shown in both views of FIG. 2, the first region 221a of the hybrid interposer 221 may have a footprint that is greater than a footprint of the second region 221b of the hybrid interposer 221. For example, as shown in the top view of FIG. 2, the second regions 221b of the hybrid interposer 221 may have a footprint that overlaps (and is smaller than) a footprint of the first region 221a of the hybrid interposer 221. Additionally, note that, while only two second regions 221b with approximately equal footprints are shown in FIG. 2, it is to be appreciated that any number of second regions 221b with equal or different footprints may be disposed on the first region 221a, and may be implemented into the hybrid interposer 221.

In some embodiment, the second regions 221b may have substantially the same thicknesses and/or the same footprints. In another embodiment, the second regions 221b may have different thicknesses and/or footprints. Furthermore, in some embodiments, the second regions 221b may have a square shape or any other desired shape that may match the shape(s) of the desired die(s). In one embodiment, the TGVs 231 of the first region 221a may have a thickness that is greater than a thickness of the TSVs 232 of the second regions 221b.

Note that the hybrid interposer 221 may include fewer or additional packaging components based on the desired packaging design.

Figure 3A:
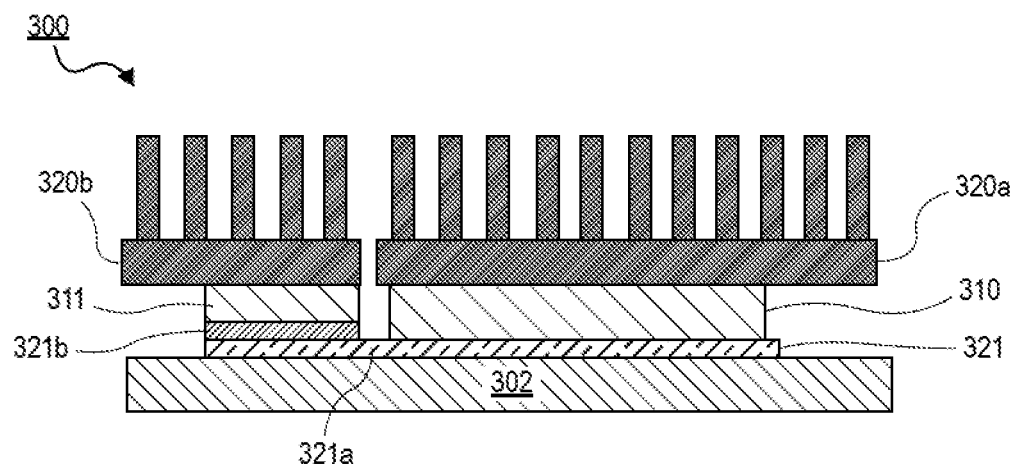
FIG. 3A is an illustration of a cross-sectional view of a semiconductor package with a plurality of heat sinks, a plurality of dies, a hybrid interposer, and a package substrate, according to one embodiment.

Referring now to FIG. 3A, a cross-sectional illustration of a semiconductor package 300 is shown, in accordance with an embodiment. In some embodiments, the semiconductor package 300 may include a plurality of heatsinks 320a-b, a plurality of dies 310-311, a hybrid interposer 321, and a package substrate 302, according to one embodiment. Additionally, in these embodiments, the hybrid interposer 321 may include a first region 321a and a second region 321b, where the first region 321a may be comprised of glass, and the second region 321b may be comprised of silicon.

The semiconductor package 300 may be substantially similar to the semiconductor package 100 of FIG. 1, with the exception that the heatsinks 320a-b are split into two separate heatsinks instead of one shared heatsink. The components of the semiconductor package 300 may be substantially similar to the components of the semiconductor package 100 described above in FIG. 1. As such, the heatsinks 320a-b, the first and second dies 310-311, the hybrid interposer 321 with the first and second regions 321a-b, and the package substrate 302 may be substantially similar to the IHS 120, the first and second dies 110-111, the hybrid interposer 121 with the first and second regions 121a-b, and the package substrate 102 described above in FIG. 1. Also, in FIG. 1, whereas the IHS 120 is one shared heatsink (or heat spreader) disposed on both the first and second dies 110-111, the heatsinks 320a-b are two or more split heatsinks disposed on the first and second dies 310-311 separately in FIG. 3A.

Accordingly, in these embodiments, a first heatsink 320a may be disposed over the first die 310, while a second heatsink 320b may be disposed over the second die 311. In some embodiments, the first heatsink 320a may have a width that is greater than a width of the second heatsink 320b. In one embodiment, the second heatsink 320b may be implemented to cover the footprints of each/all of the second die(s) 311. In another embodiment, the second heatsink 320b may be implemented to cover the footprint of the second die 311 only, while another similar heatsink, such as the second heatsink 320b, may be used to cover the footprint(s) of the other second dies if needed.

Note that the semiconductor package 300 of FIG. 3A may include fewer or additional packaging components based on the desired packaging design.

Figure 3B:
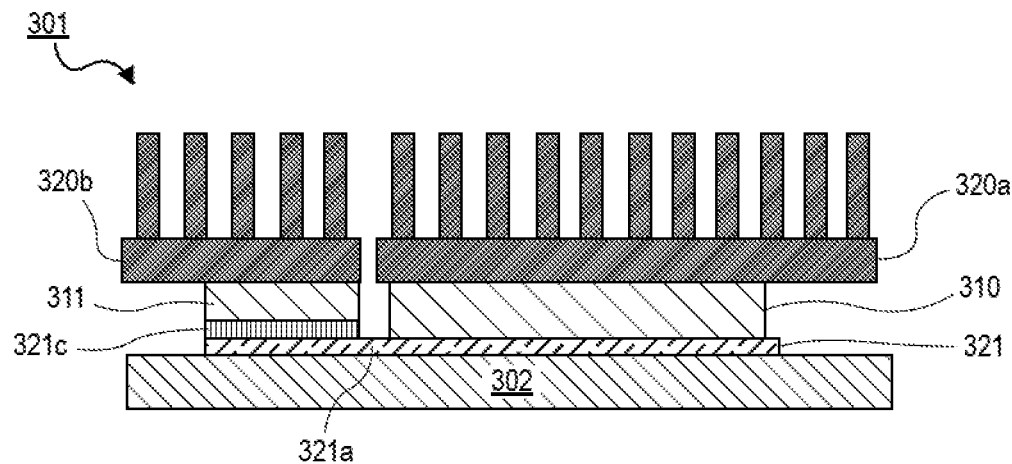
FIG. 3B is an illustration of a cross-sectional view of a semiconductor package with a plurality of heat sinks, a plurality of dies, a hybrid interposer, and a package substrate, according to one embodiment.

Referring now to FIG. 3B, a cross-sectional illustration of a semiconductor package 301 is shown, in accordance with an embodiment. In some embodiments, the semiconductor package 301 may include a plurality of heatsinks 320a-b, a plurality of dies 310-311, a hybrid interposer 321, and a package substrate 302, according to one embodiment. Additionally, in these embodiments, the hybrid interposer 321 may include a first region 321a and a second region 321c.

The semiconductor package 301 may be substantially similar to the semiconductor package 300 of FIG. 3A, with the exception that the second region 321c is comprised of diamond (or the like). The components of the semiconductor package 301 may be substantially similar to the components of the semiconductor package 100 and 300 described above in FIGS. 1 and 3A. As such, the heatsinks 320a-b, the first and second dies 310-311, the hybrid interposer 321 with the first and second regions 321a and 321c, and the package substrate 302 may be substantially similar to the IHS 120, the first and second dies 110-111, the hybrid interposer 121 with the first and second regions 121a-b, and the package substrate 102 described above in FIG. 1. Also, in FIG. 3A, whereas the second region 321b of the hybrid interposer 321 is comprised of silicon, the second region 321c of the hybrid interposer 321 is comprised of diamond (or the like) in FIG. 3B.

Note that the semiconductor package 301 of FIG. 3B may include fewer or additional packaging components based on the desired packaging design.

Figure 3C:
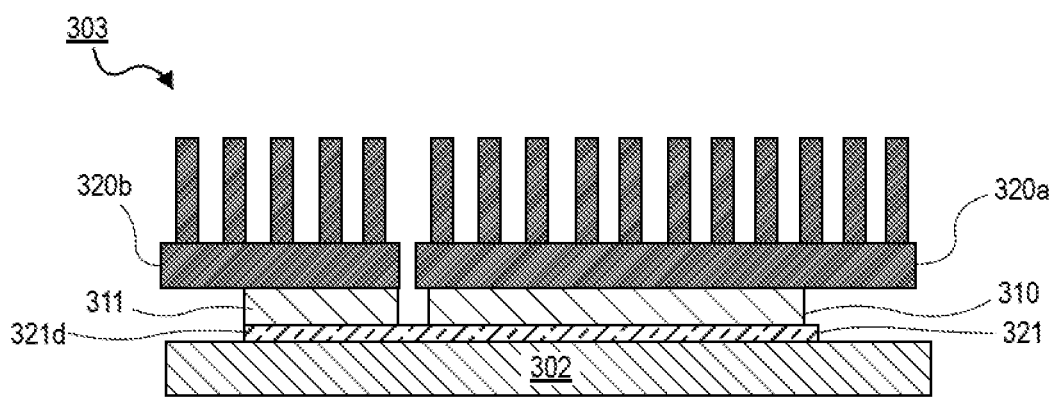
FIG. 3C is an illustration of a cross-sectional view of a semiconductor package with a plurality of heat sinks, a plurality of dies, a hybrid interposer, and a package substrate, according to one embodiment.

Referring now to FIG. 3C, a cross-sectional illustration of a semiconductor package 303 is shown, in accordance with an embodiment. In some embodiments, the semiconductor package 303 may include a plurality of heatsinks 320a-b, a plurality of dies 310-311, a hybrid interposer 321, and a package substrate 302, according to one embodiment. Additionally, in these embodiments, the hybrid interposer 321 may include a first region 321d only.

The semiconductor package 303 may be substantially similar to the semiconductor packages 300-301 of FIG. 3A-3B, with the exception that the first region 321d is comprised of glass and is the only region (and materials) of the hybrid interposer 321. The components of the semiconductor package 303 may be substantially similar to the components of the semiconductor package 100 and 300-301 described above in FIGS. 1 and 3A-3B. As such, the heatsinks 320a-b, the first and second dies 310-311, the hybrid interposer 321 with the first region 321d only, and the package substrate 302 may be substantially similar to the IHS 120, the first and second dies 110-111, the hybrid interposer 121 with the first and second regions 121a-b, and the package substrate 102 described above in FIG. 1. Also, in FIGS. 3A-3B, whereas the hybrid interposer 321 has the first and second regions 321a and 321b/321c, the hybrid interposer 321 has only one first region 321d comprised of glass in FIG. 3C.

Note that the semiconductor package 303 of FIG. 3C may include fewer or additional packaging components based on the desired packaging design.

Figure 4:
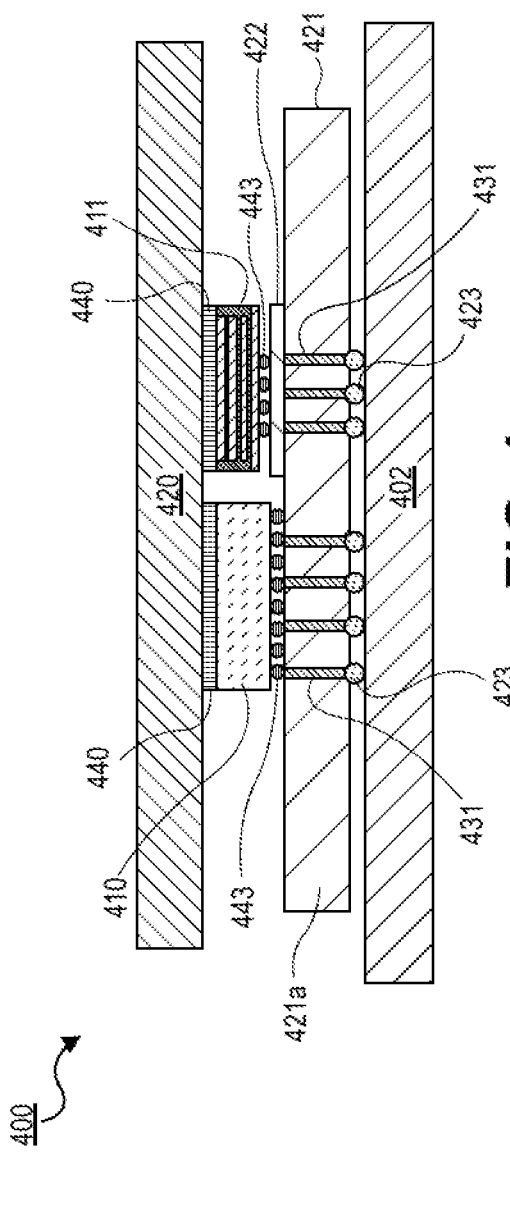
FIG. 4 is an illustration of a cross-sectional view of a semiconductor package with an IHS, a plurality of dies, a hybrid interposer, a dummy die, and a package substrate, according to one embodiment.

Referring now to FIG. 4, a cross-sectional illustration of a semiconductor package 400 is shown, in accordance with an embodiment. In some embodiments, the semiconductor package 400 may include an IHS 420, a plurality of dies 410-411, a hybrid interposer 421, a dummy die 422, and a package substrate 402, according to one embodiment. The semiconductor package 400 may be substantially similar to the semiconductor package 100 of FIG. 1, with the exception that the hybrid interposer 421 only includes the first region 421a comprised solely of glass, and that the hybrid interposer 421 is directly coupled to the dummy die 422 (e.g., a high-k dummy die (or interposer)).

The components of the semiconductor package 400 may be substantially similar to the components of the semiconductor package 100 described above in FIG. 1. As such, the IHS 420, the TIM 440, the first and second dies 410-411, the solder balls 423 and 443, the hybrid interposer 421 with the first region 421a and the TGVs 431, and the package substrate 402 may be substantially similar to the IHS 120, the TIM 140, the first and second dies 110-111, the solder balls 123 and 143, the hybrid interposer 121 with the first region 121a and the TGVs 131, and the package substrate 102 described above in FIG. 1. Also, whereas the hybrid interposer 121 includes the first and second regions 121a-b, and the second die 111 is directly coupled onto the second region 121b of the hybrid interposer 121 in FIG. 1, the hybrid interposer 421 only includes the first region 421a comprised solely of glass, and the dummy die 422 is directly coupled between the second die 411 and the first region 421a of the hybrid interposer 421 in FIG. 4.

In an embodiment, the dummy die 422 may be a high-k dummy die, a high-k dummy interposer, or the like. The dummy die 422 may include one or more high-k materials, such as elements that include hafnium, silicon, gold, silver, silicon carbide, titanium, tantalum, lanthanum, aluminum, zirconium, barium, strontium, yttrium, lead, scandium, niobium, and/or zinc. As used herein, a "high-k" refers to a material having a higher thermal conductivity (k) than silicon oxide, where the terms "oxide," "carbide," "nitride," etc. refer to compounds containing, respectively, oxygen, carbon, nitrogen, etc. Examples of high-k materials that may be implemented for the dummy die 422 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In one embodiment, the dummy die 422 may have one or more interconnects to conductively couple the second die 411 to the hybrid interposer 421. For one embodiment, the dummy die 422 may be directly disposed and coupled onto the top surface of the hybrid interposer 421. While, in other embodiments, the dummy die 422 may be disposed and coupled to the hybrid interposer 421 with an adhesive layer, one or more solder balls, or the like. Also, in some embodiments, the IHS 420 may be a single/shared heatsink and/or a split/separated heatsink (e.g., as shown with the split heatsinks 320a-b of the FIGS. 3A-3B).

Note that the semiconductor package 400 may include fewer or additional packaging components based on the desired packaging design.

Figure 5:
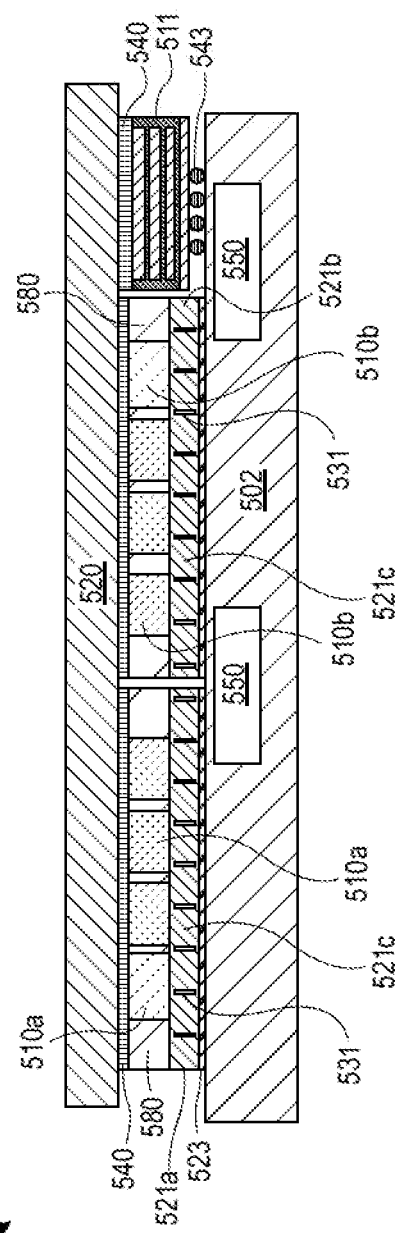
FIG. 5 is an illustration of a cross-sectional view of a semiconductor package with an IHS, a plurality of dies, a hybrid interposer, and a package substrate, according to one embodiment.

Referring now to FIG. 5, a cross-sectional illustration of a semiconductor package 500 is shown, in accordance with an embodiment. In some embodiments, the semiconductor package 500 may include an IHS 520, a plurality of dies 510a-b and 511, a plurality of bridges 550, an encapsulation layer 580, a plurality of hybrid interposers 521a-b, and a package substrate 502, according to one embodiment. The semiconductor package 500 may be substantially similar to the semiconductor package 100 of FIG. 1, with the exception that the hybrid interposers 521a-b only include the first region 521c comprised solely of glass, that the hybrid interposers 521a-b are split into two hybrid interposers that are separately coupled to two sets of first dies 510a-b, and that the encapsulation layer 580 is disposed over the hybrid interposers 521a-b, where the encapsulation layer 580 surrounds (or embeds) the first dies 510a-b between the TIMs 540 and the hybrid interposers 521a-b.

The components of the semiconductor package 500 may be substantially similar to the components of the semiconductor package 100 described above in FIG. 1. As such, the IHS 520, the TIM 540, the first and second dies 510a-b and 511, the solder balls 543, the hybrid interposers 521a-b with the first region 521c and the TGVs 531, and the package substrate 502 may be substantially similar to the IHS 120, the TIM 140, the first and second dies 110-111, the solder balls 143, the hybrid interposer 121 with the first region 121a and the TGVs 131, and the package substrate 102 described above in FIG. 1. Also, whereas the hybrid interposer 121 includes the first and second regions 121a-b, and the first die 110 is a single die coupled to the hybrid interposer 121 with the solder balls 143 in FIG. 1, the hybrid interposers 521a-b only include the first region 521c comprised solely of glass, and are split into two hybrid interposers separately coupled to the first dies 510a-b, and the encapsulation layer 580 is disposed over the hybrid interposers 521a-b, where the encapsulation layer 580 surrounds (or embeds) the first dies 510a-b between the TIMs 540 and the hybrid interposers 521a-b in FIG. 5.

In one embodiment, the hybrid interposer 521a-b are disposed and coupled onto the top surface of the package substrate 502 with an adhesive layer 523 (or the like). For one embodiment, the first dies 510a-b may be disposed and coupled onto the hybrid interposers 521a-b respectively. In some embodiments, the first dies 510a-b may be a plurality of chiplet dies (or the like). For one embodiment, the second die 511 may have a thickness that is greater than a thickness of the first dies 510a-b. In one embodiment, the thickness of the second die 511 may be substantially equal to the combined thicknesses of the first dies 510a-b and the hybrid interposer 521a-b. While, in another embodiment, the thickness of the second die 511 may be different from the combined thicknesses of the first dies 510a-b and the hybrid interposer 521a-b. Also, in some embodiments, the IHS 520 may be a single/shared heatsink and/or a split/separated heatsink (e.g., as shown with the split heatsinks 320a-b of the FIGS. 3A-3B). Note that, in some embodiments, the thickness of the TIM 540 disposed over the second die 511 may be substantially equal to or different from the thickness of the TIM 540 disposed over the first dies 510a-b.

In an embodiment, the bridges 550 may be disposed in the package substrate 502, and the bridges 550 may communicatively couple the first and second dies 510a-b and 511 and/or the hybrid interposers 521a-b. In an embodiment, the bridges 550 may comprise electrical routings (or interconnect structures) that may communicative couple the first dies 510a-b and the second die 511. In an embodiment, the bridges 550 may be a silicon bridge, a glass bridge, or a bridge made of any other substrate material that is suitable for forming bridges. In some embodiments, the bridges 550 may be referred to as embedded multi-die interconnect bridges (EMIBs). For additional embodiments, the bridges 550 may include a plurality of TSVs that may be further used to couple bridges 550 to the hybrid interposers 521a-b, the first regions 521a-b, and/or the second die 511.

For one embodiment, the encapsulation layer 580 may be disposed over the first dies 510a-b and the hybrid interposer 521a-b, where the encapsulation layer 580 surrounds the first dies 510a-b. As shown in FIG. 5, the encapsulation layer 580 embeds the first dies 510a-b between the TIMs 540 and the respective hybrid interposers 521a-b. In one embodiment, the encapsulation layer 580 may include one or more encapsulation materials such as a mold material, an underfill material, a filler material, any similar material(s), and/or any combination thereof. For one embodiment, the encapsulation layer 580 may be planarized as the top surface of the encapsulation layer 580 may be substantially coplanar to the top surfaces of the first dies 510a-b.

Note that the semiconductor package 500 may include fewer or additional packaging components based on the desired packaging design.

Figure 6:
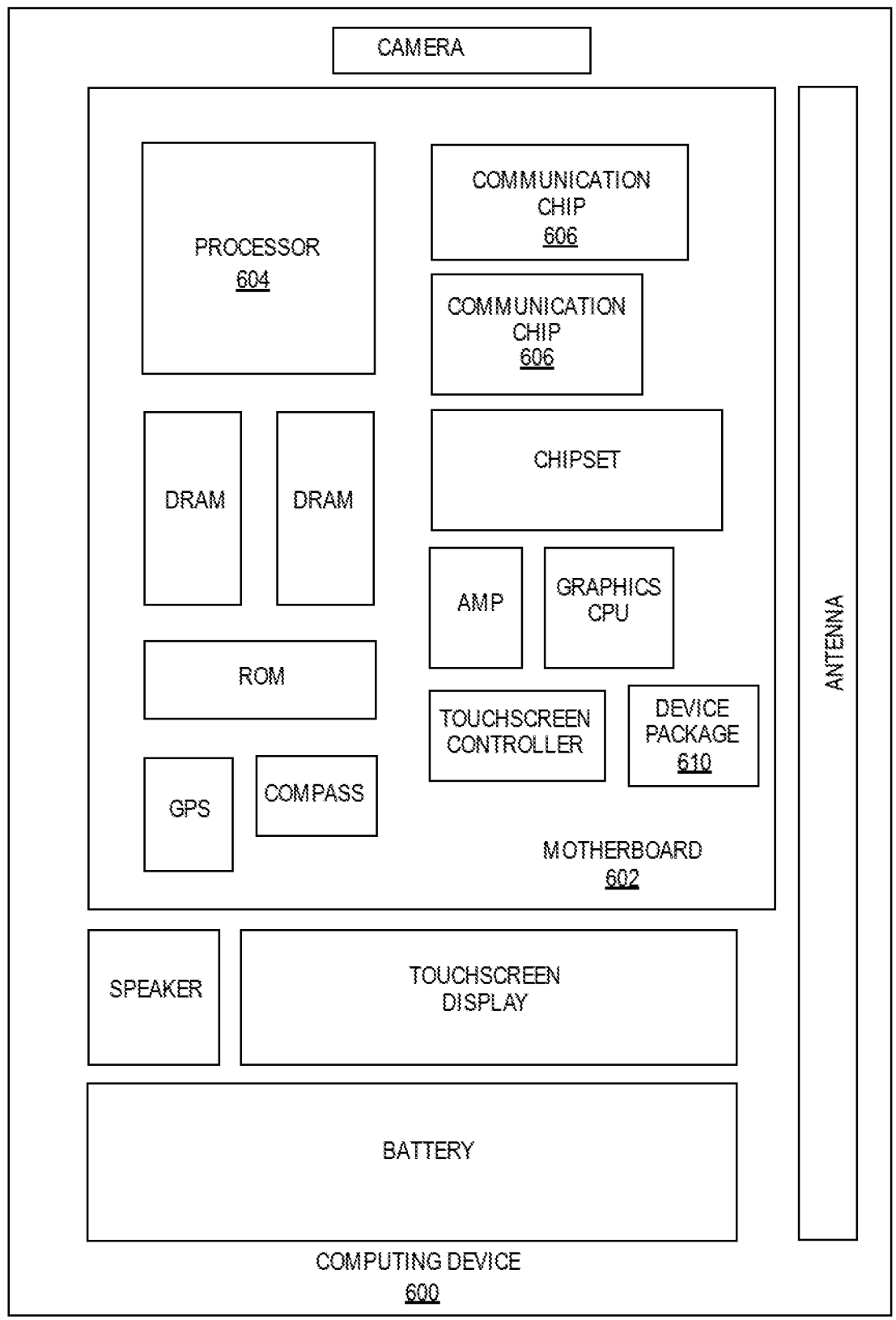
FIG. 6 is an illustration of a schematic block diagram illustrating a computer system that utilizes a semiconductor package with an IHS, a plurality of dies, a hybrid interposer, and a package substrate, according to one embodiment.

FIG. 6 is an illustration of a schematic block diagram illustrating a computer system 600 that utilizes a device package 610 (or a semiconductor package) with an IHS, a plurality of dies, a hybrid interposer, and a package substrate, according to one embodiment. FIG. 6 illustrates an example of computing device 600. Computing device 600 houses a motherboard 602. Motherboard 602 may include a number of components, including but not limited to processor 604, device package 610 (or semiconductor package), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be a semiconductor package that may include, but is not limited to, a substrate, a package substrate, and/or a PCB. In one embodiment, device package 610 may be substantially similar to the semiconductor packages of FIGS. 1, 3A-3B, 4, and 5 described herein. Device package 610 may include the hybrid interposer with the first region and/or the second region as described herein (e.g., as illustrated and described above with the hybrid interposers of FIGS. 1-5)—or any other components from the figures described herein.

Note that device package 610 may be a single component/device, a subset of components, and/or an entire system, as the materials, features, and components may be limited to device package 610 and/or any other component of the computing device 600 that may need the hybrid interposer as described herein (e.g., the motherboard 602, the processor 604, and/or any other component of the computing device 600 that may need the embodiments of the hybrid interposers and/or the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip 606 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a hybrid interposer includes a first region and a second region, wherein the first region is comprised of glass materials, and wherein the second region is comprised of silicon materials or diamond materials; a first die on the first region of the hybrid interposer, wherein the first die is directly coupled to the first region of the hybrid interposer; a second die on the second region of the hybrid interposer, wherein the second die is directly coupled to the second region of the hybrid interposer; and an IHS over the first die, the second die, and the hybrid interposer.

In example 2, the subject matter of example 1 can optionally include that the hybrid interposer further includes a plurality of first interconnects and a plurality of second interconnects, wherein the plurality of first interconnects vertically extend from a bottom surface of the first region to a top surface of the first region, and wherein the plurality of second interconnects vertically extend from a bottom surface of the second region to a top surface of the second region.

In example 3, the subject matter of examples 1-2 can optionally include that the plurality of first interconnects are a plurality of TGVs, and wherein the plurality of second interconnects are a plurality of TSVs.

In example 4, the subject matter of examples 1-3 can optionally include that the hybrid interposer further includes a third region, wherein the third region is comprised of the one or more silicon materials, wherein the plurality of second interconnects vertically extend from a bottom surface of the third region to a top surface of the third region, wherein the third region has a footprint that is substantially equal to a footprint of the second region, wherein the third region has a thickness that is substantially equal to a thickness of the second region, wherein the first region has a footprint that is greater than the footprints of the second and third regions, and wherein the first region has a thickness that is substantially equal to or greater than the thicknesses of the second and third regions.

In example 5, the subject matter of examples 1-4 can optionally include that the second and third regions are directly disposed on the top surface of the first region, wherein the second and third regions are both positioned adjacent to an outer edge of the first region of the hybrid interposer, wherein the second region is adjacent to the third region, and the second region is separated from the third region by a gap, and wherein the plurality of TSVs of the second and third regions are directly disposed and coupled onto the plurality of TGVs of the first region.

In example 6, the subject matter of examples 1-5 can optionally include the hybrid interposer on a package substrate, wherein the hybrid interposer is conductively coupled to the package substrate with a plurality of first solder balls; and a TIM directly on the first and second dies, wherein the TIM directly couples top surfaces of the first and second dies to a bottom surface of the IHS, and wherein the first and second dies are conductively coupled to the hybrid interposer with a plurality of second solder balls.

In example 7, the subject matter of examples 1-6 can optionally include that the first die is a CPU or a GPU.

In example 8, the subject matter of examples 1-7 can optionally include that the second die is a HBM or a stack of HBMs.

In example 9, the subject matter of examples 1-8 can optionally include that the IHS includes a first heatsink and a second heat sink, wherein the first heatsink is separated from the second heatsink by a first gap, wherein the first heatsink is only coupled to the first die with the TIM, and wherein the second heatsink is only coupled to the second die with the TIM.

Example 10 is a semiconductor package, comprising: a hybrid interposer includes a first region, wherein the first region is only comprised of glass materials; a first die on the first region of the hybrid interposer, wherein the first die is directly coupled to the first region of the hybrid interposer; a third die directly on the first region of the hybrid interposer, wherein the third die is a dummy die or a dummy interposer, and wherein the third die is comprised of one or more high-k materials; a second die over the third die and the first region of the hybrid interposer, wherein the second die is directly coupled to the third die, and wherein the third die is between the second die and the hybrid interposer; and an IHS over the first die, the second die, the third die, and the hybrid interposer.

In example 11, the subject matter of example 10 can optionally include that the hybrid interposer further includes a plurality of first interconnects, and wherein the plurality of first interconnects vertically extend from a bottom surface of the first region to a top surface of the first region.

In example 12, the subject matter of examples 10-11 can optionally include that the plurality of first interconnects are a plurality of TGVs.

In example 13, the subject matter of examples 10-12 can optionally include that the first die has a thickness that is substantially equal to a thickness of the second and third dies.

In example 14, the subject matter of examples 10-13 can optionally include that the third die is directly disposed on the top surface of the first region of the hybrid interposer, and wherein the third die is directly coupled to the plurality of TGVs of the first region of the hybrid interposer.

In example 15, the subject matter of examples 10-14 can optionally include the hybrid interposer on a package substrate, wherein the hybrid interposer is conductively coupled to the package substrate with a plurality of first solder balls; and a TIM directly on the first and second dies, wherein the TIM directly couples top surfaces of the first and second dies to a bottom surface of the IHS, wherein the first die is conductively coupled to the hybrid interposer with a plurality of second solder balls, and wherein the second die is conductively coupled to the third die with the plurality of second solder ball.

In example 16, the subject matter of examples 10-15 can optionally include that the first die is a CPU or a GPU.

In example 17, the subject matter of examples 10-16 can optionally include that the second die is a HBM or a stack of HBMs.

In example 18, the subject matter of examples 10-17 can optionally include that the IHS includes a first heatsink and a second heat sink, wherein the first heatsink is separated from the second heatsink by a gap, wherein the first heatsink is only coupled to the first die with the TIM, and wherein the second heatsink is only coupled to the second die with the TIM.

Example 19 is a semiconductor package, comprising: a plurality of hybrid interposers on a package substrate, wherein the plurality of hybrid interposers include first regions, and wherein the first regions are only comprised of glass materials; a plurality of first dies on the first regions of the plurality of hybrid interposers, wherein the plurality of first dies are directly coupled to the first regions of the plurality of hybrid interposers; a second die on the package substrate, wherein the second die is directly coupled to the package substrate, wherein the second die has a thickness that is greater than a thickness of the plurality of first dies; and an IHS over the plurality of first dies, the second die, the plurality of hybrid interposers, and the package substrate.

In example 20, the subject matter of example 19 can optionally include that the plurality of hybrid interposers further include a plurality of first interconnects, wherein the plurality of first interconnects vertically extend from bottom surfaces of the first regions to top surfaces of the first regions, and wherein the plurality of first interconnects are a plurality of TGVs.

In example 21, the subject matter of examples 19-20 can optionally include that the plurality of hybrid interposers have substantially equal thicknesses.

In example 22, the subject matter of examples 19-21 can optionally include that the plurality of hybrid interposers are separated by a gap, wherein the plurality of first dies are directly disposed on the top surfaces of the plurality of hybrid interposers, and wherein the plurality of first dies are directly coupled to the plurality of TGVs of the first regions of the plurality of hybrid interposers.

In example 23, the subject matter of examples 19-22 can optionally include a plurality of bridges in the package substrate, wherein the plurality of bridges communicatively couple the plurality of first dies to the second die; an adhesive layer directly coupled to the plurality of hybrid interposers and the package substrate; an encapsulation layer over the plurality of hybrid interposers, wherein the encapsulation layer surrounds the plurality of first dies; and a TIM directly on the plurality of first dies, the second die, and the encapsulation layer, wherein the TIM directly couples top surfaces of the plurality of first dies, the second die, and the encapsulation layer to a bottom surface of the IHS, and wherein the second die is conductively coupled to the package substrate with a plurality of solder balls.

In example 24, the subject matter of examples 19-23 can optionally include that the second die is a HBM or a stack of HBMs, and wherein the plurality of bridges are a plurality of embedded multi-die interconnect bridges EMIBs.

In example 25, the subject matter of examples 19-24 can optionally include that the IHS includes a first heatsink and a second heat sink, wherein the first heatsink is separated from the second heatsink by a first gap, wherein the first heatsink is only coupled to the plurality of first dies and the encapsulation layer with the TIM, and wherein the second heatsink is only coupled to the second die with the TIM.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a hybrid interposer including a first region and a second region, wherein the first region is comprised of a low thermal conductive material, wherein the second region is comprised of a silicon material or diamond material, wherein the second region is in direct contact with the first region, and wherein the low thermal conductive material of the first region is laterally adjacent to the silicon material or diamond material of the second region;
   a first die on the first region of the hybrid interposer, wherein the first die is directly coupled to the first region of the hybrid interposer;
   a second die on the second region of the hybrid interposer, wherein the second die is directly coupled to the second region of the hybrid interposer; and
   an integrated heat spreader (IHS) over the first die, the second die, and the hybrid interposer.

2. The semiconductor package of claim 1, wherein the low thermal conductive material of the first region is comprised of glass material or one or more thermal conductive materials, wherein the one or more thermal conductive materials have a thermal conductivity of approximately 10 W/mK or less, wherein the hybrid interposer further includes a plurality of first interconnects and a plurality of second interconnects, wherein the plurality of first interconnects vertically extend from a bottom surface of the first region to a top surface of the first region, and wherein the plurality of second interconnects vertically extend from a bottom surface of the second region to a top surface of the second region.

3. The semiconductor package of claim 2, wherein the plurality of first interconnects are a plurality of through-glass vias (TGVs), and wherein the plurality of second interconnects are a plurality of through-silicon vias (TSVs).

4. The semiconductor package of claim 3, wherein the hybrid interposer further includes a third region, wherein the third region is comprised of one or more silicon materials, wherein the plurality of second interconnects vertically extend from a bottom surface of the third region to a top surface of the third region, wherein the third region has a footprint that is substantially equal to a footprint of the second region, wherein the third region has a thickness that is substantially equal to a thickness of the second region, wherein the first region has a footprint that is greater than the footprints of the second and third regions, and wherein the first region has a thickness that is substantially equal to or greater than the thicknesses of the second and third regions.

5. The semiconductor package of claim 4, wherein the second and third regions are directly disposed on the top surface of the first region, wherein the second and third regions are both positioned adjacent to an outer edge of the first region of the hybrid interposer, wherein the second region is adjacent to the third region, and the second region is separated from the third region by a gap, and wherein the plurality of TSVs of the second and third regions are directly disposed and coupled onto the plurality of TGVs of the first region.

6. The semiconductor package of claim 5, further comprising:
   the hybrid interposer on a package substrate, wherein the hybrid interposer is conductively coupled to the package substrate with a plurality of first solder balls; and
   a thermal interface material (TIM) directly on the first and second dies, wherein the TIM directly couples top surfaces of the first and second dies to a bottom surface of the IHS, and wherein the first and second dies are conductively coupled to the hybrid interposer with a plurality of second solder balls.

7. The semiconductor package of claim 6, wherein the IHS includes a first heatsink and a second heat sink, wherein the first heatsink is separated from the second heatsink by a first gap, wherein the first heatsink is only coupled to the first die with the TIM, and wherein the second heatsink is only coupled to the second die with the TIM.

8. The semiconductor package of claim 1, wherein the first die is a central processing unit (CPU) die or a graphic processing unit (GPU) die.

9. The semiconductor package of claim 1, wherein the second die is a stack of dies, a high bandwidth memory (HBM) die, or a stack of HBM dies.

10. A semiconductor package, comprising:
    a hybrid interposer including a first region and a second region, wherein the first region is comprised of low thermal conductive materials, and wherein the second region is comprised of silicon materials or diamond materials;
    a first die on the first region of the hybrid interposer, wherein the first die is directly coupled to the first region of the hybrid interposer;
    a second die on the second region of the hybrid interposer, wherein the second die is directly coupled to the second region of the hybrid interposer; and
    an integrated heat spreader (IHS) over the first die, the second die, and the hybrid interposer, wherein the low thermal conductive materials of the first region are comprised of glass materials or one or more thermal conductive materials, wherein the one or more thermal conductive materials have a thermal conductivity of approximately 10 W/mK or less, wherein the hybrid interposer further includes a plurality of first interconnects and a plurality of second interconnects, wherein the plurality of first interconnects vertically extend from a bottom surface of the first region to a top surface of the first region, and wherein the plurality of second interconnects vertically extend from a bottom surface of the second region to a top surface of the second region, wherein the plurality of first interconnects are a plurality of through-glass vias (TGVs), and wherein the plurality of second interconnects are a plurality of through-silicon vias (TSVs), wherein the hybrid interposer further includes a third region, wherein the third region is comprised of the one or more silicon materials, wherein the plurality of second interconnects vertically extend from a bottom surface of the third region to a top surface of the third region, wherein the third region has a footprint that is substantially equal to a footprint of the second region, wherein the third region has a thickness that is substantially equal to a thickness of the second region, wherein the first region has a footprint that is greater than the footprints of the second and third regions, and wherein the first region has a thickness that is substantially equal to or greater than the thicknesses of the second and third regions, wherein the second and third regions are directly disposed on the top surface of the first region, wherein the second and third regions are both positioned adjacent to an outer edge of the first region of the hybrid interposer, wherein the second region is adjacent to the third region, and the second region is separated from the third region by a gap, and wherein the plurality of TSVs of the second and third regions are directly disposed and coupled onto the plurality of TGVs of the first region.

11. The semiconductor package of claim 10, further comprising:
the hybrid interposer on a package substrate, wherein the hybrid interposer is conductively coupled to the package substrate with a plurality of first solder balls; and
a thermal interface material (TIM) directly on the first and second dies, wherein the TIM directly couples top surfaces of the first and second dies to a bottom surface of the IHS, and wherein the first and second dies are conductively coupled to the hybrid interposer with a plurality of second solder balls.

12. The semiconductor package of claim 10, wherein the first die is a central processing unit (CPU) die or a graphic processing unit (GPU) die.

13. The semiconductor package of claim 10, wherein the second die is a stack of dies, a high bandwidth memory (HBM) die, or a stack of HBM dies.

14. The semiconductor package of claim 11, wherein the IHS includes a first heatsink and a second heat sink, wherein the first heatsink is separated from the second heatsink by a first gap, wherein the first heatsink is only coupled to the first die with the TIM, and wherein the second heatsink is only coupled to the second die with the TIM.

* * * * *